(12) United States Patent
Sasaki (10) Patent No.: US 12,339,155 B2
(45) Date of Patent: Jun. 24, 2025

(54) SENSOR

(71) Applicant: Kuwana Metals, Ltd., Kuwana (JP)

(72) Inventor: Akira Sasaki, Mie-ken (JP)

(73) Assignee: Kuwana Metals, Ltd., Kuwana (JP)

( * ) Notice: Subject to any disclaimer, the term of this patent is extended or adjusted under 35 U.S.C. 154(b) by 0 days.

(21) Appl. No.: 17/910,505

(22) PCT Filed: Feb. 19, 2021

(86) PCT No.: PCT/JP2021/006277
§ 371 (c)(1),
(2) Date: Sep. 9, 2022

(87) PCT Pub. No.: WO2021/192754
PCT Pub. Date: Sep. 30, 2021

(65) Prior Publication Data
US 2023/0136617 A1  May 4, 2023

(30) Foreign Application Priority Data
Mar. 25, 2020 (JP) ................... 2020-053575

(51) Int. Cl.
*G01F 23/72* (2006.01)
(52) U.S. Cl.
CPC .................... *G01F 23/72* (2013.01)
(58) Field of Classification Search
CPC ...... G01F 23/30–76; H01R 13/58–585; G01K 1/08; G01K 1/14; G01D 11/30
See application file for complete search history.

(56) References Cited

U.S. PATENT DOCUMENTS

| 3,493,205 A * | 2/1970 | Bromberg ............ H02G 3/0633 |
| | | 16/2.5 |
| 6,195,013 B1 | 2/2001 | Robinson |
| 10,714,234 B2 * | 7/2020 | Ushiro ................. G01J 1/0219 |

FOREIGN PATENT DOCUMENTS

| CN | 102012250 A | | 4/2011 |
| CN | 210293367 U | * | 4/2020 |
| JP | 55072451 A | | 5/1980 |
| JP | H05288593 A | | 11/1993 |
| JP | H08128900 A | | 5/1996 |

(Continued)

OTHER PUBLICATIONS

CNIPA, First Office Action issued in Chinese Patent Application No. 202180016095.4, Jan. 21, 2025, 17 pages.

*Primary Examiner* — Justin N Olamit
(74) *Attorney, Agent, or Firm* — NOD Law PC (57) ABSTRACT

A sensor comprises a protecting tube fixed to a through hole formed in a partition of a container, a detection part arranged inside the protecting tube, conducting wires connected with the detection part in the inside of the protecting tube, and a fixing member fixed to the partition, and the conducting wires are detachably fixed to the fixing member outside the protecting tube. In a preferred embodiment, the container is an airtight container, and the protecting tube is fixed to the partition indivisibly and integrally. Thereby, a sensor which comprises a detection part and conducting wires in the inside of a protecting tube fixed to a partition of a container and makes it possible to easily exchange a part of members at the time of malfunction and easily adjust a position of the detection part, etc., by a simple structure can be provided.

14 Claims, 7 Drawing Sheets

(56) References Cited

FOREIGN PATENT DOCUMENTS

| | | | |
|---|---|---|---|
| JP | 2000280887 A | | 10/2000 |
| JP | 2001296168 A | | 10/2001 |
| JP | 2001356041 A | | 12/2001 |
| JP | 2002071432 A | | 3/2002 |
| JP | 2004186077 A | | 7/2004 |
| JP | 2010066122 A | | 3/2010 |
| KR | 20090095781 A | * | 9/2009 |
| WO | WO-2009125167 A1 | * | 10/2009 ........... H02G 15/007 |

* cited by examiner

Prior Art

SENSOR

BACKGROUND

Field

The present invention relates to a sensor.

Background

In order to detect a state inside a container constituted by partitions, various kinds of sensors are used. For example, a temperature sensor is used in order to detect a temperature inside a container, and a liquid level sensor is used in order to detect a position of a liquid level of a liquid stored in a container. These sensors are arranged at a specific position inside of a container to detect states, such as a temperature and existence of liquid at the position.

For the above-mentioned objective, a type of a sensor that a detection part is housed inside a protecting tube inserted into a container and an electric signal is taken out to the outside of the container through conducting wires connected to the detection part has been known. By fixing the protecting tube to a partition of the container, the position of the detection part can be fixed at arbitrary positions inside the container. Moreover, by configuring the protecting tube such that liquid and/or gas stored in the container, etc., may not enter the inside of the protecting tube, the liquid and/or gas can be prevented from contacting directly with the detection part.

For example, a liquid level sensor which a liquid storage tank described in the Japanese Patent Application Laid-Open (kokai) No. 2001-296168 (PTL1) comprises, is constituted by a guide pipe (protecting tube) suspended from a lid of the tank inside the tank, two reed switches (detection part) housed and arranged at upper and lower positions inside the guide pipe, and a float which is equipped with a permanent magnet and movable up and down. From an upper end of the guide pipe, lead wires (conducting wires) connected to the reed switches are pulled out. By preparing a mounting groove near the upper end of the guide pipe, inserting the upper end of the guide pipe into a cylinder part (through hole) prepared in the lid of the tank, and fitting and attaching a retaining ring into the mounting groove, the whole liquid level sensor is attached inside the tank in an exchangeable state.

Moreover, in a detector described in the Japanese Patent Application Laid-Open (kokai) No. 2001-356041 (PTL2), conducting wires connected to a detection part inserted into a tubular body with one end part blocked is pulled out from an end part on the other side of the tubular body, the end part of the other side is filled up with synthetic resin material, and thereby flameproof construction is attained. Thereby, a detector with electric explosion proof can be provided without needing equipment, such as a barrier relay.

Furthermore, in a multipoint detection type magnetic proximity switch described in the Japanese Patent Application Laid-Open (kokai) No. 2004-186077 (PTL3), a plurality of magnetic induction parts and codes are inserted through a through hole formed in a bush arranged inside an end part on an opening side of a housing and through a plurality of guide holes formed inside the housing, respectively, and the bush is compressed by a tightening member. In accordance with this, by using a configuration simplified further than a conventional technology, the codes can be fixed by elastic deformation of the bush, and the magnetic induction parts can be fixed at arbitrary positions.

SUMMARY

According to an aspect, a sensor comprises a protecting tube, a detection part, conducting wires, and a fixing member, characterized in that: said protecting tube is fixed to a through hole formed in a partition of a container, an inner end that is one end of said protecting tube is located in the inside of said container, and an outer end that is the other end of said protecting tube opens toward the outside of said container, said detection part is housed in the inside of said protecting tube, one end of said conducting wires is connected to said detection part in the inside of said protecting tube, and the other end of said conducting wires protrudes toward the outside of said container from said outer end, said fixing member is fixed to said partition, and fixes said conducting wires detachably in the outside of said protecting tube. Said conducting wires are prevented from moving in a longitudinal direction of said protecting tube in the inside of said protecting tube and said detection part connected to said conducting wires is held at a predetermined position, and the position of said detection part housed in the inside of said protecting tube can be changed by releasing the fixation of said conducting wires to said fixing member and changing the position of said conducting wires to be fixed to said fixing member, and thereafter fixing said conducting wires to said fixing member again.

According to another aspect, a sensor comprises a protecting tube, a detection part, conducting wires, and a fixing member, characterized in that said protecting tube is fixed to a through hole formed in a partition of a container, an inner end that is one end of said protecting tube is located in the inside of said container, and an outer end that is the other end of said protecting tube opens toward the outside of said container, said detection part is housed in the inside of said protecting tube, said detection part is a detection part using one or more detection parts chosen from a group consisting of a thermistor, a resistance temperature detector, a thermocouple, a Hall element and a reed switch, one end of said conducting wires is connected to said detection part in the inside of said protecting tube, and the other end of said conducting wires protrudes toward the outside of said container from said outer end. Said fixing member is fixed to said partition, and fixes said conducting wires detachably in the outside of said protecting tube, said conducting wires are prevented from moving in a longitudinal direction of said protecting tube in the inside of said protecting tube and said detection part connected to said conducting wires is held at a predetermined position, and the position of said detection part housed in the inside of said protecting tube can be changed by releasing the fixation of said conducting wires to said fixing member and changing the position of said conducting wires to be fixed to said fixing member, and thereafter fixing said conducting wires to said fixing member again.

According to yet another aspect, a sensor comprises a protecting tube, a detection part, conducting wires and a fixing member, characterized in that said protecting tube is fixed to a through hole formed in a partition of a container, an inner end that is one end of said protecting tube is located in the inside of said container, and an outer end that is the other end of said protecting tube opens toward the outside of said container, said container is an airtight container, said protecting tube is fixed indivisibly and integrally with said partition, said inner end is closed, said detection part is housed in the inside of said protecting tube, one end of said conducting wires is connected to said detection part in the inside of said protecting tube, and the other end of said conducting wires protrudes toward the outside of said container from said outer end, said fixing member is fixed to said partition, and fixes said conducting wires detachably in the outside of said protecting tube. Said conducting wires are prevented from moving in a longitudinal direction of said protecting tube in the inside of said protecting tube and said detection part connected to said conducting wires is held at a predetermined position, and the position of said detection part housed in the inside of said protecting tube can be changed by releasing the fixation of said conducting wires to said fixing member and changing the position of said conducting wires to be fixed to said fixing member, and thereafter fixing said conducting wires to said fixing member again.

BRIEF DESCRIPTION OF THE DRAWINGS

FIG. 5 is (a) an enlarged perspective view of the fixing member according to the preferred embodiment of the present invention and (b) a perspective view for showing another example of a configuration of a fixing piece.

DETAILED DESCRIPTION

Technical Problem

As mentioned above, a sensor comprising a protecting tube is equipment essential for detecting a state inside a container. By the way, it may become necessary to remove a sensor from a container or attach a new sensor to a container in a case of a malfunction and/or an inspection of a sensor. Moreover, it may become necessary to adjust (or change) a position of a detection part of a sensor in association with a change of an intended use and/or a use condition of a container to which a sensor is attached, etc., for example. However, in the above-mentioned Patent document 1 and Patent Document 2, such an attaching and detaching of a sensor and/or a position adjustment of a detection part is neither considered nor referred to. In the multipoint detection type magnetic proximity switch described in the Patent Document 3, a position adjustment of a detection part is intended. However, although it has a configuration simplified further than a conventional technology, it is necessary to prepare an exclusive bush and guide holes corresponding to shapes and numbers of a magnetic induction part and codes, and there is a possibility of causing complication and enlargement of its structure. As a result, there is a possibility that problems, such as increase of a manufacturing cost and a fall of a degree of freedom in designing, may arise, for example.

Moreover, also in every prior art, since a hole for fixing a protecting tube is prepared in a partition of a container, there is a possibility that contents of a container may leak out through a gap between the hole and the protecting tube to the outside of the container. Therefore, in a case where a pressure inside a container becomes high and/or a case where a chemical substance harmful to a human body is stored in a container, etc., it is necessary to constitute the whole container airtight without any gap to prevent leakage of contents. For this objective, it is effective to indivisibly and integrally configure a hole formed in a partition of a container and a protecting tube for a sensor. Specifically, for example, a partition of a container and a protecting tube consisting of a metal or an alloy shall be welded, or a partition of a container and a protecting tube consisting of a thermoplastic resin shall be melt-bonded.

However, in a case where a hole formed in a partition of a container and a protecting tube for a sensor are indivisibly and integrally configured as mentioned above, since the container and the protecting tube cannot be separated, the whole sensor cannot be exchanged together with the protecting tube even in a case of malfunction of the sensor. Therefore, a detection part and conducting wires shall be temporarily fixed inside a protecting tube using an adhesive, etc., and the detection part and the conducting wires shall be exchanged when required. However, when fixing them by an adhesive, the fixation by the adhesive must be released whenever the detection part and the conducting wires are to be exchanged and/or the position of the detection part is to be adjusted. For this reason, a new problem that operations for the exchange and/or adjustment become complicated occurs.

The present invention has been conceived in view of various subjects as mentioned above, and one of objectives thereof is to provide a sensor which comprises a protecting tube fixed to a partition of a container and makes it possible to easily exchange a part of members at the time of malfunction and easily adjust a position of a detection part, etc., by a simple structure.

Solution to Problem

A sensor according to the present invention (which may be referred to as a "present invention sensor" hereafter) is a sensor comprising a protecting tube, a detection part, conducting wires and a fixing member. The protecting tube is fixed to a through hole formed in a partition of a container, an inner end that is one end of the protecting tube is located in the inside of the container, and an outer end that is the other end of the protecting tube opens toward the outside of the container. The detection part is housed in the inside of the protecting tube. One end of the conducting wires is connected to the detection part in the inside of the protecting tube, and the other end of the conducting wires protrudes toward the outside of the container from the outer end. The fixing member is fixed to the partition of the container, and is configured so as to fix the conducting wires detachably in the outside of the protecting tube.

In the present invention sensor, the conducting wires protruding from the end of the protecting tube, which opens toward the outside of the container, (outer end) can be manually taken out and inserted in an axis direction of the protecting tube. Thereby, for example, the broken detection part and conducting wires can be taken out to be replaced with normal products, and/or a position of the detection part connected with the conducting wires can be adjusted to an arbitrary position. After the replacement and/or position adjustment of the detection part have been completed, by detachably fixing the conducting wires to the fixing member in this state, the conducting wires can be prevented from moving and the detection part connected with the conducting wires can be held at a position after the adjustment.

Moreover, the detection part may be one or more detection parts chosen from a group consisting of a thermistor, a resistance temperature detector, a thermocouple, a Hall element and a reed switch. Furthermore, the container to which the present invention sensor is applied may be a liquid storage tank. In this case, the detection part may be a Hall element or a reed switch, and a float which comprises a permanent magnet and can move in a longitudinal direction of the protecting tube can be configured as a liquid level sensor.

In addition, the container to which the present invention sensor is applied may be an airtight container. In this case, the protecting tube is fixed indivisibly and integrally with the partition of the container, and one end of the protecting tube located in the inside of the container (inner end) is closed.

Advantageous Effects of Invention

In accordance with the present invention, a sensor which makes it possible to easily exchange a part of members at the time of malfunction and easily adjust a position of a detection part, etc., by a simple structure can be provided. Moreover, in a case where a pressure inside the container becomes high and/or a case where a chemical substance harmful to a human body is stored in the container, etc., leakage of contents thereof can be certainly prevented by applying the present invention to an airtight container, fixing the protecting tube indivisibly and integrally with the partition of the container, and closing the inner end of the protecting tube. Furthermore, the present invention sensor has a simpler and compacter configuration as compared with a sensor according to a conventional technology. Therefore, in accordance with the present invention sensor, the above-mentioned subjects can be solved, while avoiding problems, such as increase of a manufacturing cost and a fall of a degree of freedom in designing, for example.

Description of Embodiments

Embodiments of the present invention will be explained below in detail using drawings. The following explanation and drawings are intended to show examples of the embodiments of the present invention, and the embodiments of the present invention are not limited to the embodiments shown in the following explanation and drawings.
<Sensor>

The present invention is an invention of a sensor 1 comprising a protecting tube 2, a detection part 3, conducting wires 4 and a fixing member 5. First, an outline of the whole sensor 1 according to the present invention will be explained. The sensor 1 is used for detecting a state inside a container constituted by a partition 6. The detection part 3 is fixed to a specific position in the container, and detects information at the position. The detected information is converted into an electric signal by the detection part 3, and the electric signal is transmitted to the outside of the container through the conducting wires 4. In order to realize these functions, the protecting tube 2 is fixed to the through hole 61 formed in the partition 6 of the container, and the detection part 3 and the conducting wires 4 are housed inside the protecting tube 2. The conducting wires 4 are detachably fixed by the fixing member 5 fixed to the partition 6 in the outside of the protecting tube 2.

Figure 1:
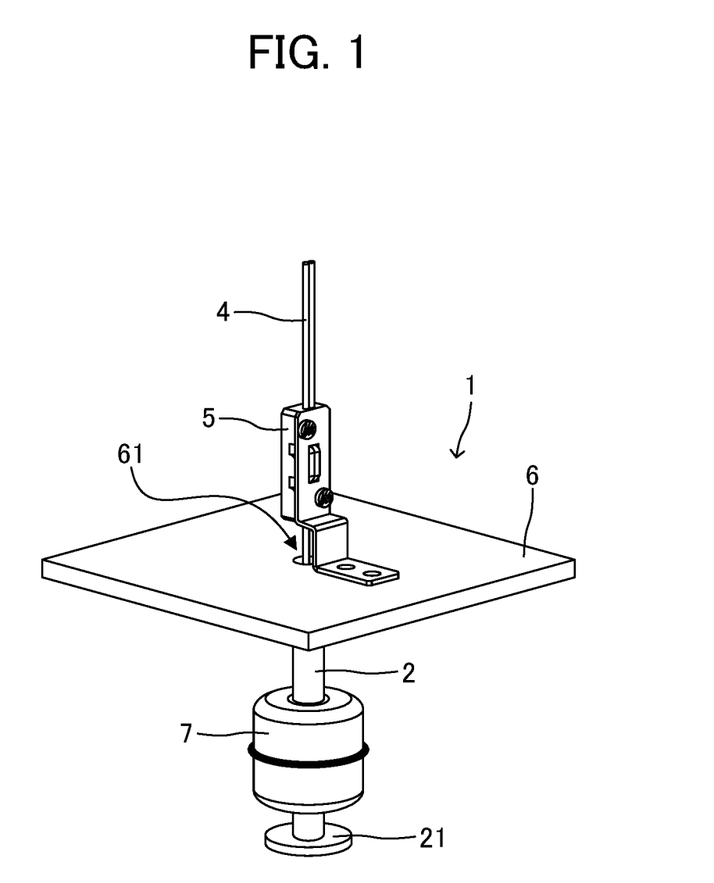
FIG. 1 is a perspective view for showing an example of a preferred embodiment of the present invention.

FIG. 1 is a perspective view for showing an example of a preferred embodiment of the present invention. The sensor 1 shown in FIG. 1 is configured as a liquid level sensor which detects a position of a liquid surface of a liquid stored in the inside of the container. The container shown here is a liquid storage tank, and the protecting tube 2 is fixed to the through hole 61 formed in the partition 6 of the liquid storage tank such that the longitudinal direction of the protecting tube 2 is parallel to an up-and-down direction of the drawing. The protecting tube 2 is equipped with the float 7 including a permanent magnet. The float 7 floats at a position of the liquid surface of the liquid inside the liquid storage tank. The position of the float 7 follows a change in a position of the liquid surface to move up and down along the longitudinal direction of the protecting tube 2. However, a flange-like stopper 21 is prepared at an end of the protecting tube 2 located inside the container (inner end) and, thereby, the float 7 is prevented from falling out of the protecting tube 2. In addition, in the following explanation, a position of the float 7 when a lower end of the float 7 is in contact with the stopper 21 may be referred to as an "initial position." Moreover, the container shown in this example is configured to be airtight for the purpose of preventing leakage of contents. Specifically, the protecting tube 2 is fixed by welding indivisibly and integrally with the through hole 61 formed in the partition 6, and the inner end of the protecting tube 2 is closed airtightly.

Figure 2:
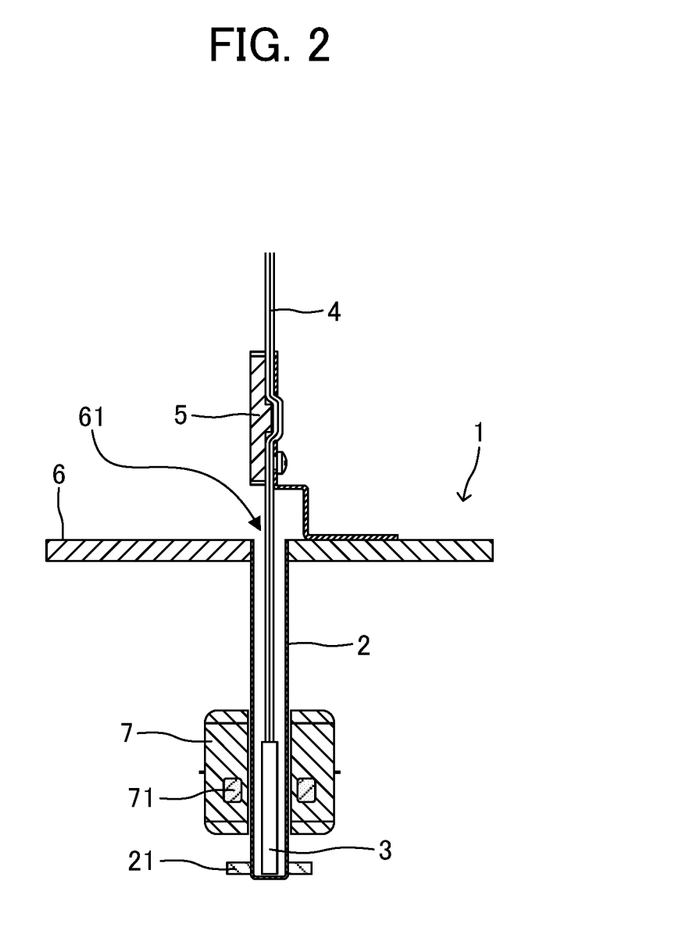
FIG. 2 is a partial sectional view for showing the preferred embodiment of the present invention.

FIG. 2 is a partial sectional view of the liquid level sensor shown in FIG. 1. The detection part 3 located in the vicinity of the inner end (closed lower end) of the protecting tube 2 is constituted by a reed switch. A contact point of the reed switch is constituted by a pair of reeds containing a ferromagnetic substance. When a permanent magnet 71 built in the float 7 approaches the detection section 3, the contact point of the reeds is closed by a magnetic field formed by the permanent magnet 71 to be brought to an energized state. When the permanent magnet 71 leaves the detection part 3, the contact point opens due to elasticity of the reeds to be brought to a power failure state (non-energized state). In the working example shown in FIG. 2, when the liquid level is low and the float 7 is at the initial position, the reed switch is brought to the energized state. When the liquid level rises and the float 7 rises from the initial position, the reed switch is brought to the power failure state. A user of the sensor 1 can detect whether a position of the liquid level is higher or lower than a position corresponding to the initial position of the float 7 with respect to the reed switch by investigating an existence of conduction between the conducting wires 4 in the outside of the container. However, as is well known to those skilled in the art, since a correspondence between switching of the energized state and the power failure state of the reed switch and a position of the float 7 (namely, height of the liquid surface) changes depending on a position of the contact point of the reed switch, a position of the stopper 21 and a position of the permanent magnet 71 inside the float 7, etc., for example, these can be determined according to an intended use of the present invention sensor.

As shown in FIG. 2, the detection part 3 is connected with the conducting wires 4. The end of conducting wires 4, which is not connected to the detection part 3, protrudes outward from the opening of the upper end of the protecting tube 2 (namely, the outer end that is the end of the protecting tube 2, which opens toward the outside of the container). The conducting wires 4 are detachably fixed to the fixing member 5 fixed to the partition 6 in the outside of the protecting tube 2. When any one of the detection part 3 or the conducting wires 4 malfunctions, the fixation of the conducting wires 4 by the fixing member 5 can be released, and the conducting wires 4 and the detection part 3 connected thereto can be pulled out of the protecting tube 2 and easily replaced with other normal detection part 3 and conducting wires 4. Moreover, when the position of the detection part 3 inside the protecting tube 2 is to be changed, it is necessary only to release the fixation of the conducting wires 4 by means of the fixing member 5, adjust the position of the detection part 3 to a desired position, and thereafter fix the conducting wires 4 to the fixing member 5 again.

<Protecting Tube>

Next, an embodiment of the present invention will be explained for each of constituents which constitute the sensor 1 according to the present invention. The protecting tube 2 is a hollow tube which can house the detection part 3 in the inside thereof. As mentioned above, when the inside of the container becomes high pressure and/or when a chemical substance harmful to a human body is stored in the container, etc., it is necessary to constitute the whole container airtight to prevent leakage of contents thereof. Moreover, generally, since the detection part 3 is a precise electronic component as will be mentioned later, it is desirable to prevent a liquid or gas stored in the container from contacting directly with the detection part 3. In such a case, it is required to intercept from an atmosphere inside the container using the protecting tube 2. Moreover, the protecting tube 2 is a member to provide a space for inserting the detection part 3 to a desired position inside the container. Furthermore, the protecting tube 2 functions also as a conduit tube through which the conducting wires 4 are inserted. In order to realize these functions, the protecting tube 2 shown in FIG. 1 and FIG. 2 is fixed to the through hole 61 formed in the partition 6 of the container, one end (inner end) is closed in the inside of the container, and the other end (outer end) opens toward the outside of the container. The inside of the protecting tube 2 having such a configuration is located inside the container but is shut off from an atmosphere inside the container, and is in communication with the outside of the container.

It is preferred that the protecting tube 2 has strength at degree to which the protecting tube 2 does not easily bend in the container. At the same time, it is preferred that the protecting tube 2 does not prevent the detection part 3 housed in the inside thereof from acquiring information about the inside of the container. For example, when the sensor 1 is constituted as the above-mentioned liquid level sensor, it is preferred that the protecting tube 2 is constituted of a nonmagnetic material such that a magnetic field generated by the permanent magnet 71 built in the float 7 is not prevented from reaching the reed switch. Moreover, when the sensor 1 is configured as a thermometer, it is preferred to make a tube thickness of the protecting tube 2 as thin as possible to reduce its heat capacity, or to constitute the protecting tube 2 of a material with good thermal conductivity. Furthermore, it is preferred that the protecting tube 2 is constituted of a material which hardly reacts with a liquid or gas stored in the container. As a material used for the protecting tube 2, for example, a material which fulfills the above-mentioned conditions can be selected from metals, alloys, ceramics and synthetic resins, etc.

<Detection Part>

The detection part 3 is a part which is housed in the inside of the protecting tube 2 and bears sensing of the sensor 1 according to the present invention. The detection part 3 has functions to collect information about the liquid or gas stored in the inside of the container through the pipe wall of the protecting tube 2 and to convert the information into an electric signal. Although a temperature sensor, a magnetic sensor, a vibration sensor, etc. can be used as the detection part 3 in the present invention, the detection part 3 is not limited to these. As a temperature sensor, a thermistor, a resistance temperature detector, a thermocouple, etc. can be used, for example. As a magnetic sensor, a Hall element and a reed switch, etc. can be used, for example. As a vibration sensor, a microphone, etc. can be used, for example. All the specific examples of the detection part 3 listed here are precise electronic components which emit an electric signal. It is preferred that the detection part 3 is constituted as an independent and easily exchangeable component. Moreover, in order to house the detection part 3 in the inside of the protecting tube 2, a thickness of the detection part 3 needs to be a size less than an internal diameter of the protecting tube 2.

In the present invention, the number of the detection parts 3 housed in the inside of the one protecting tube 2 may be one, or may be two or more. When the number of the detection part 3 is one, a position of the detection part 3 in the protecting tube 2 can be held at an arbitrary position from the inner end to the outer end of the protecting tube 2. When the number of detection parts 3 is two or more, positions of respective detection parts 3 in the protecting tube 2 can be held at mutually different positions, for example, like the two upper and lower reed switches described in the above-mentioned Patent Document 1 (PTL1). When a plurality of the detection parts 3 are housed in the inside of the one protecting tube 2, all or a part of the detection parts 3 may be of an identical type, or all the detection parts 3 may be mutually different.

<Conducting Wire>

The conducting wires 4 transmit the electric signal converted by the detection part 3 installed in the inside of the container to the outside of the container. In order to realize this function, the conducting wires 4 in the present invention have one end connected to the detection part 3 in the inside of the protecting tube 2, and have the other end protrude toward the outside from the open end (outer end) of the protecting tube 2. For one detection part 3, two conducting wires 4 are usually connected. It is preferred that the conducting wires 4 comprise a well-known insulating coating for preventing unintentional short circuit and/or leakage of electricity, etc., except for the end parts. Some detection parts 3 need an auxiliary conducting wire for heating a heater in addition to the conducting wires for taking out an electric signal, etc., for example. The conducting wires 4 which the present invention sensor comprises may contain such an auxiliary conducting wire. One conducting wire 4 may be constituted by one conductor, or may be constituted by twisting many thin conductors together. As a conductor constituting the conducting wires 4, low-oxygen copper or other well-known metals or alloys can be used.

In addition to the above-mentioned function as a transmission path of electric signals, the conducting wires 4 in the present invention also has a function to hold the position of the detection part 3 connected with the conducting wires 4 at a specific position inside the protecting tube 2 by having a part thereof fixed to the fixing member 5, as will be mentioned later. In order to realize this function certainly, it is preferred that the conducting wires 4 have mechanical strength at degree to which the conducting wires 4 neither expand and contract in a longitudinal direction nor bend easily. In order to raise mechanical strength, it is effective to make a thickness of the conductor thicker, or to thicken a thickness of the insulating coating, etc. However, when the conducting wires 4 are made too thick, it will become difficult to house the detection part 3 connected with the conducting wires 4 in the inside of the protecting tube 2. Especially, when a plurality of the detection parts 3 are housed in the inside of one protecting tube 2, it is preferred to determine the thickness of the conducting wires 4 such that the detection parts 3 are not prevented from being housed in the inside of the protecting tube 2.

It is preferred that the conducting wires 4 in the present invention easily cause plastic deformation in a part fixed to the fixing member 5 mentioned later, and have durability which can resist repetition with fixation and release by the fixing member 5. When the conducting wires 4 easily cause plastic deformation, the fixation by the fixing member 5 becomes stronger, and the position of the detection part 3 is prevented from shifting in the middle of using the sensor 1. Moreover, when the durability of the conducting wires 4 is increased, an identical set of the detection part 3 and conducting wires 4 can be used for a long time while repeatedly adjusting the position of the detection part 3. On the other hand, parts of the conducting wires 4 to be fixed to the fixing member 5 may be able to be elastically deformed at an appropriate elastic modulus and may have durability which can bear repetition with fixation and release by the fixing member 5. Also in this case, it becomes easy to prevent the position of the detection part 3 from shifting in the middle of using the sensor 1 and to repeatedly adjust the position of the detection part 3 while using an identical set of the detection part 3 and conducting wires 4.

The detection part 3 may be a thermocouple, the conducting wires 4 may be constituted by two kinds of noble metal wires, and the detection part 3 may be constituted by a welded part of these noble metals. There is a possibility that conducting wires 4 constituted of the noble metals cannot bear repetition with fixation and release by the fixing member 5. In such a case, it is preferred to connect compensating lead wires having higher durability than the noble metal wires with the noble metal wires to constitute the conducting wires 4 and to fix the parts of the compensating lead wires to the fixing member 5. Moreover, a type of a thermocouple, in which two kinds of noble metal wires welded at their tips are sealed in the inside of a metal protecting tube that is referred to as a sheath has been also known. In this case, the welded tip part corresponds to the detection part 3 in the present invention, and the part of the noble metal wires covered with the sheath corresponds to the conducting wires 4 of the present invention.

<Fixing Member>

The fixing member 5 is a member for fixing the conducting wires 4 at a predetermined position. The fixing member 5 is fixed to the partition 6 of the container. The protecting tube 2 is also fixed to the through hole 61 formed in the same partition 6. Therefore, by fixing the conducting wires 4 to the fixing member 5, the entire conducting wires 4 are prevented from moving in the direction of an axis of the protecting tube 2 (longitudinal direction) in the inside of the protecting tube 2. When the position of the entire conducting wires 4 is fixed, the position of one detection part 3 connected to the conducting wires 4 and housed in the inside of the protecting tube 2 is held at a specific position or the positions of two or more detection parts 3 connected to the conducting wires 4 and housed in the inside of the protecting tube 2 are held at specific positions. When the detection part 3 is held at a predetermined position in this way, it becomes possible for the sensor 1 to use the detection part 3 to perform sensing at a specific position inside the container. The fixation of the conducting wires 4 by the fixing member 5 is performed in the outside of the protecting tube 2. More specifically, since the end of the conducting wires 4 protrudes from the open end (outer end) of the protecting tube 2 toward the outside of the protecting tube 2, the protruding part of the conducting wires 4 is fixed to the fixing member 5. Since the fixation and/or release of the conducting wires 4 by the fixing member 5 is not performed in the inside of the protecting tube 2, but in a large space in the outside of the protecting tube 2, operations for the fixation and/or release can be easily performed.

In the present invention, the fixing member 5 detachably fixes the conducting wires 4. Here, "detachably fixes" means that the conducting wires 4 which has once fixed to the fixing member 5 can be separated from the fixing member 5 again without being destroyed. When the position of the detection part 3 housed in the inside of the protecting tube 2 is to be changed, it is necessary only to release the fixation of the conducting wires 4 to the fixing member 5 first, then change the position of the conducting wires 4 to be fixed to the fixing member 5, and thereafter fix the conducting wires 4 to the fixing member 5 again. In the present invention, since the conducting wires 4 are detachably fixed to the fixing member 5, the above-mentioned operations for adjusting the position of the detection part 3 can be performed many times repeatedly without destroying the conducting wires 4 and the fixing member 5.

Moreover, when the detection part 3 and/or the conducting wires 4 are broken and either one or both of them need to be exchanged, it is necessary only to release the fixation of the conducting wires 4 to the fixing member 5 first and take out the detection part 3 and the conducting wires 4 from the protecting tube 2, then house a new detection part 3 and/or conducting wires 4 in the inside of the protecting tube 2, adjust the position of the detection part 3, and thereafter fix the conducting wires 4 to the fixing member 5 in the outside of the protecting tube 2. In the present invention, since the conducting wires 4 are detachably fixed to the fixing member 5, operations for exchanging the detection part 3 and/or the conducting wires 4 can be carried out quite easily.

Figure 3:
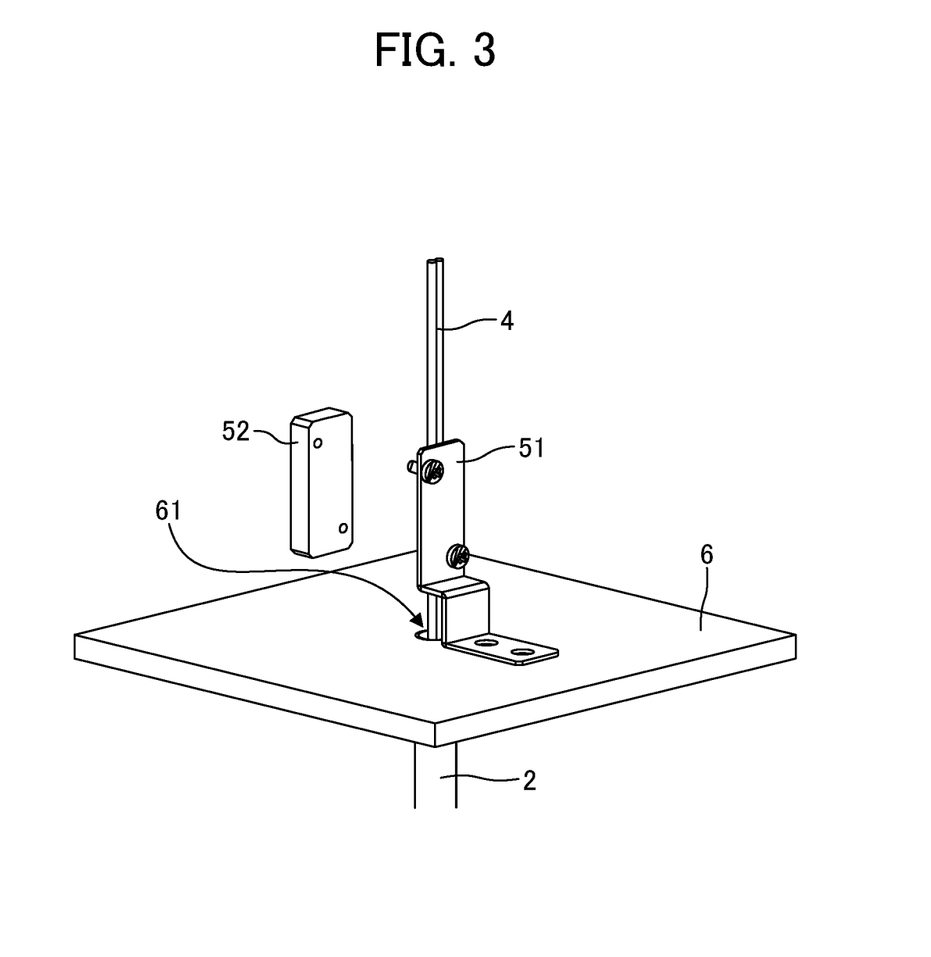
FIG. 3 is an enlarged perspective view of a fixing member according to a preferred embodiment of the present invention.

In the present invention, a structure of the fixing member 5 may be any structure as long as the conducting wires 4 can be detachably fixed. FIG. 3 is an enlarged perspective view of a part of the fixing member 5 according to a preferred embodiment of the present invention. In the preferred embodiment of the present invention, the fixing member 5 comprises a main body 51 fixed to the partition 6 and a fixing piece 52 which can be joined to the main body 51. The conducting wires 4 are pinched and fixed between the main body 51 and the fixing piece 52. In this preferred embodiment, the conducting wires 4 are pinched between the main body 51 and the fixing piece 52 and subjected compression stress from both of them. Since static frictional force due to the compression stresses arises between surfaces of the conducting wires 4 and respective surfaces of the main body 51 and the fixing piece 52, the conducting wires 4 are fixed to the fixing member 5 and the position thereof cannot be moved easily.

In the preferred embodiment of the present invention, the main body 51 may be fixed to the partition 6 detachably by screwing, for example, etc., or it may be fixed by welding, for example. Even when the fixation between the main body 51 and the partition 6 is steadfast, such as welding, effects by the present invention can be acquired as long as the fixation of the conduction wires 4 by the main body 51 and the fixing piece 52 is detachable. In the fixing member 5 exemplified in FIG. 3, the main body 51 and the fixing piece 52 are configured such that the main body 51 and the fixing piece 52 can be tightened by two male screws inserted through holes prepared in the main body 51 and two screw holes prepared in the fixing piece 52. The conducting wires 4 can be detachably fixed to the fixing member 5 by screwing the male screws into the screw hole in a state where the conducting wires 4 are pinched between the main body 51 and the fixing piece 52.

Figure 4:
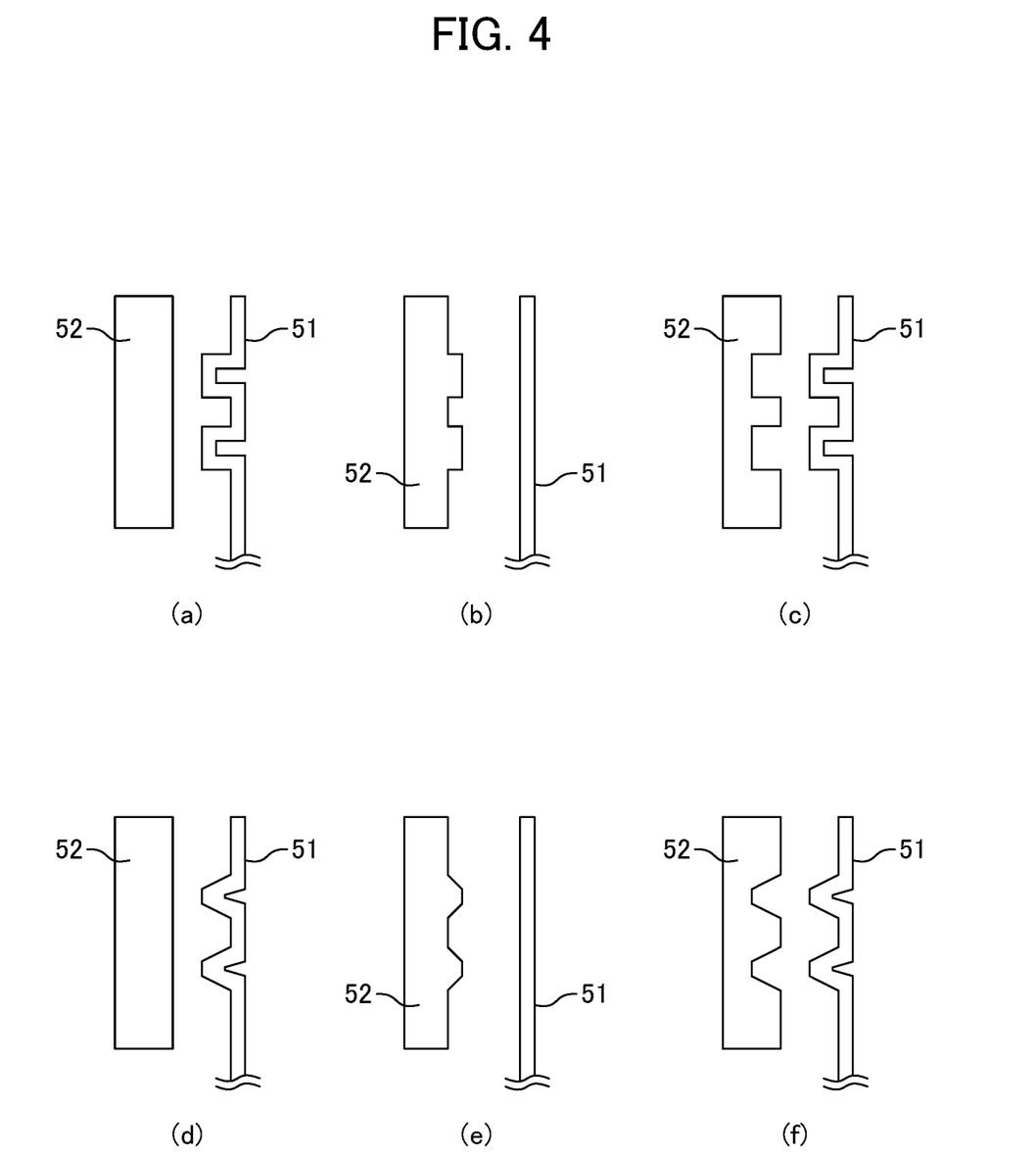
FIG. 4 is a schematic view for showing some specific examples of surfaces of main bodies and surfaces of fixing pieces for pinching conducting wires.

By the way, from a viewpoint of holding the conducting wires 4 more securely and firmly between the main body 51 and the fixing piece 52, it is preferred that irregularities formed on either one or both of the surface of the main body 51 and the surface of the fixing piece 52 which pinch the conducting wires 4. FIG. 4 is a schematic view for exemplifying an embodiment in which irregularities are formed on either one or both of the surface of the main body 51 and the surface of the fixing piece 52 which pinch the conducting wires 4 like this. However, the conducting wires 4 are omitted in FIG. 4. As shown in (a), (b), (d) and (e) of FIG. 4, irregularities may be formed only on either one of the surface of the main body 51 and the surface of the fixing piece 52 which pinch the conducting wires 4. Alternatively, as shown in (c) and (0 of FIG. 4, irregularities may be formed on both of the surface of the main body 51 and the surface of the fixing piece 52 which pinch the conducting wires 4. Moreover, although a plurality of irregularities are formed on either one or both of the surface of the main body 51 and the surface of the fixing piece 52 which pinch the conducting wires 4 in the example shown in FIG. 4, the number of irregularities is not limited as long as it is possible to detachably fix the conducting wires 4 to the fixing member 5. For example, only one concave part and/or convex part may be formed.

Figure 5:
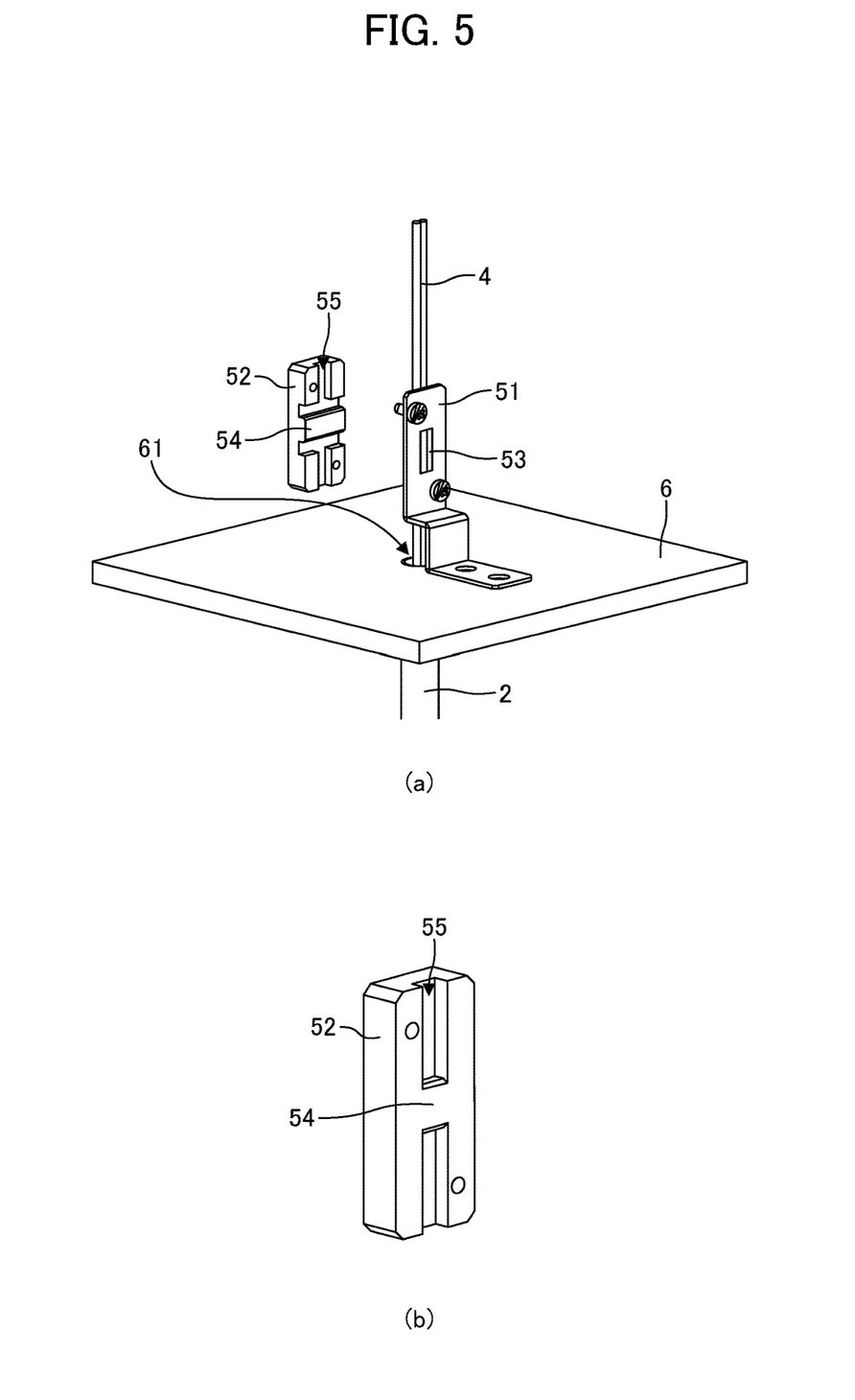

Next, referring to (a) of FIG. 5, in a more preferred embodiment of the present invention, one of the main body 51 or the fixing piece 52 has a fixing hole 53, and the other of the main body 51 or the fixing piece 52 has the convex part 54 at a position corresponding to a position of the fixing hole 53. By joining the fixing piece 52 to the main body 51, the conducting wires 4 are pushed out toward the fixing hole 53 by the convex part 54 and fixed. In (a) of FIG. 5, a state before the conducting wires 4 are fixed to the fixing member 5 is shown. In the embodiment of the present invention shown in (a) of FIG. 5, the fixing hole 53 is prepared in a central part of the largest surface of the main body 51. Moreover, the convex part 54 is formed in a central part of the fixing piece 52 that is a position corresponding to the fixing hole 53. From the state shown in (a) of FIG. 5, by tightening two screws to join the fixing piece 52 to the main body 51, the conducting wires 4 is pushed out toward the fixing hole 53 by the convex part 54 to be detachably fixed.

In FIG. 1 and FIG. 2, a final state where the conducting wires 4 are fixed by the fixing member 5 is shown. In this final state, the conducting wires 4 have been pushed out toward the fixing hole 53 using the convex part 54 to be deformed. In order to move the conducting wires 4 from this state in an up-and-down direction of the drawing, it is necessary to cause a new deformation of the conducting wires 4. For this reason, in the embodiment of the present invention shown in FIG. 1 and FIG. 2, the conducting wires 4 can be fixed more firmly as compared with a case where the conducting wires 4 are fixed only by static friction force as mentioned above. In addition, although the fixing hole 53 is prepared in the main body 51 and the convex part 54 is prepared in the fixing piece 52 in the above-mentioned embodiment, the fixation can also be performed as strongly as in the above-mentioned embodiment even when the fixing hole 53 is prepared in the fixing piece 52 and the convex part 54 is prepared in the main body 51 conversely to the above.

In the fixing member 5 shown in (a) of FIG. 5, the main body 51 can be constituted by a bent metal plate, etc., for example. Moreover, the fixing piece 52 can be constituted by a block of a metal or an alloy in which a groove and a screw hole are prepared, etc., for example. In the fixing piece 52 shown in (a) of FIG. 5, a groove 55 prepared in parallel with the up-and-down direction of the drawing is a relief groove for housing the conducting wires 4. Height of the convex part 54 is the same as height of a surface where the screw holes are prepared. Thereby, when the fixing piece 52 is joined to the main body 51, the convex part 54 can push out the conducting wires 4 certainly toward the fixing hole 53.

By the way, in order to push out the conducting wires 4 toward the fixing hole 53 and to house the conducting wires 4 as mentioned above, it should be sufficient to form only the convex part 54 and the relief groove 55 on the fixing piece 52, as shown in (b) of FIG. 5, for example. The fixed piece 52 as shown in (b) of FIG. 5 can be easily fabricated by resin molding, such as injection molding, for example. However, it is difficult to process a terminal (end edge) of the relief groove 55 (end portion on a side of the convex 54) as exemplified in (b) of FIG. 5 only by forming the relief groove 55 on a metal piece (e.g., an aluminum piece, etc.) by machining, such as milling, for example. Therefore, in the fixing piece 52 exemplified in (a) of FIG. 5, two grooves are formed at the top and bottom of the convex part 54 so as to intersect orthogonally with the relief groove 55 for housing the conducting wires 4. However, configurations of the main body 51 and the fixing piece 52 are not limited to the above-mentioned configuration, and are not limited in particular as long as it is possible to pinch and fix the conducting wires 4 between the main body 51 and the fixing piece 52.

<Container>

Although a container is not included in the configuration of the sensor 1 according to the present invention, the sensor 1 is configured on the premise that the sensor 1 is fixed to the partition 6 of the container to be used. The container to which the sensor 1 according to the present invention is fixed may be any container provided that the container has the partition 6 separating the inside from the outside. For example, a tank for storing a liquid or a gas and a heat treatment furnace or a furnace room of a reaction furnace, etc. may correspond to the container in the present invention. The protecting tube 2 which constitutes the sensor 1 according to the present invention is fixed to the through hole 61 formed in the partition 6 of the container. It is preferred that the position of the through hole 61 in the partition 6 constituting the container is as close as possible to the position where the information about the inside needs to be detected by the sensor 1. The partition 6 shown in FIG. 1 to FIG. 3 and FIG. 5 is a cutout of only a part, to which the protecting tube 2 and the fixing member 5 are fixed, of the partition 6 constituting the container. Although a shape of the partition 6 is shown as a rectangle, there is no particular meaning in this shape. In these drawings, a side to which the protecting tube 2 is fixed corresponds to the inside of the container, and a side to which the fixing member 5 is fixed corresponds to the outside of the container. However, the end (outer end) of the protecting tube 2 which opens toward the outside of the container does not necessarily have to be flush with the partition 6, but may protrude from the partition 6. Moreover, the entire fixing member 5 does not necessarily have to be located outside of the container, as long as this is acceptable in an intended use of the container to which the sensor 1 is applied. Namely, configurations of the fixing member 5 are not limited in particular as long as it possible for the fixing member 5 to be fixed to the partition 6 and to detachably fix the conducting wires 4 in the outside of the protecting tube 2.

In a preferred embodiment of the present invention, the container is an airtight container, and the protecting tube 2 is fixed indivisibly and integrally with the partition 6. As mentioned above, in a case where a pressure inside the container becomes high and/or a case where a chemical substance harmful to a human body is stored in the container, etc., it is preferred to constitute the whole container airtight without any gap to prevent leakage of the contents. For this objective, it is effective to configure indivisibly and integrally the through hole 61 formed in the partition 6 of the container and the protecting tube 2 for the sensor 1. Specifically, for example, the partition 6 of the container and the protecting tube 2 consisting of a metal or an alloy shall be welded, or the partition 6 of the container and the protecting tube 2 consisting of a thermoplastic resin shall be melt-bonded. Moreover, in these cases, the end of the protecting tube 2 located in the inside of the container (inner end) is closed airtightly.

By the way, as mentioned above, techniques for fixing the conducting wires 4 with the fixing member 5 to hold the detection part 3 at an intended position in the inside of the protecting tube 2 when replacing the detection part 3 and/or the conducting wires 4 or adjusting the position of the detection part 3 are not particularly limited. For example, a point at which the conducting wires 4 are to be fixed by the fixing member 5 may be identified in advance depending on a distance between a fixing point in the fixing member 5 and a point at which a sensing part of the detection part 3 is to be held, and the conducting wires 4 may be fixed by the fixing member 5 at that point. Alternatively, for example, when the end of the protecting tube 2 that is located inside the container (inner end) is closed, the detection part 3 can be certainly held at a position corresponding to the position of the inner end of the protecting tube 2 by lowering the detection part 3 in the inside of the protecting tube 2 until the detection part 3 comes into contact with the inner end of the protecting tube 2.

Figure 6:
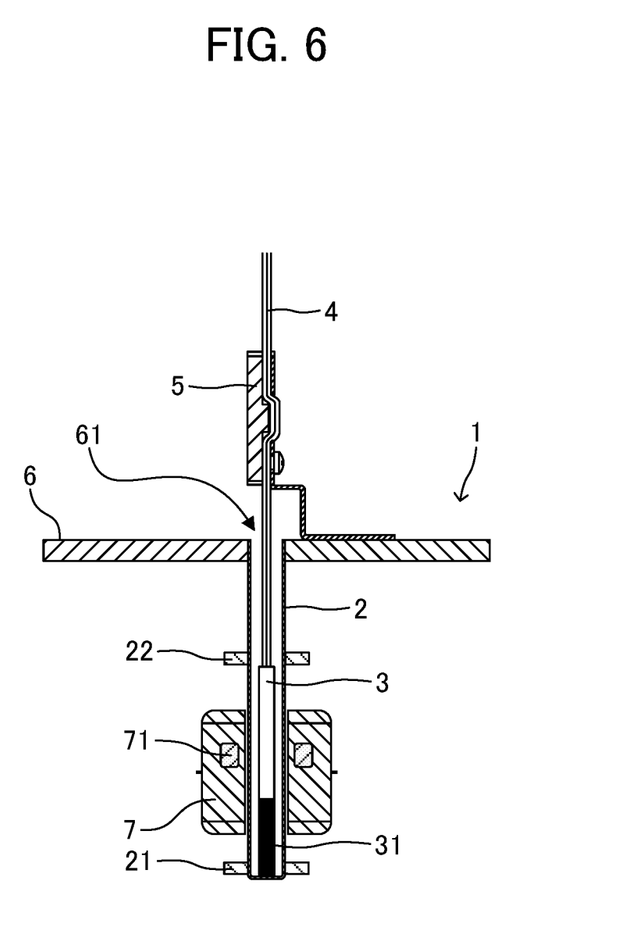
FIG. 6 is a partial sectional view for showing the preferred embodiment of the present invention.

When the detection part 3 is held at a predetermined position between the inner end of the protecting tube 2 and the end which opens toward the outside of the container (outer end) by a technique as mentioned above, a spacer may be prepared at a tip of the detection part 3 (namely, at the inner end of the protecting tube 2). FIG. 6 is a partial sectional view the sensor 1 according to such an embodiment of the present invention. The sensor 1 exemplified in FIG. 6 has the same configuration as the sensor 1 shown in FIG. 2, except that the sensor 1 further comprises a stopper 22 which defines an upper limit position of the float 7 in addition to a stopper 21 which defines a lower limit position of the float 7 and that the sensor 1 further comprises a spacer 31 which is located on a tip side (inner end side) of the detection part 3 in the inside of the protecting tube 2.

In the sensor 1 exemplified in FIG. 6, as mentioned above, the spacer 31 is disposed on a side of the inner end of the detection part 3 (on a side of the end of the protecting tube 2 located in the inside of the container) in the inside of the protecting tube 2. Therefore, the detection part 3 can be certainly held at a desired position by lowering the detection part 3 until the spacer 31 having a predetermined length comes into contact with the inner end of the protecting tube 2 in the inside of the protecting tube 2. When changing the position of the detection part 3 in the inside of the protecting tube 2, it is necessary only to change the length of the spacer 31.

Figure 7:
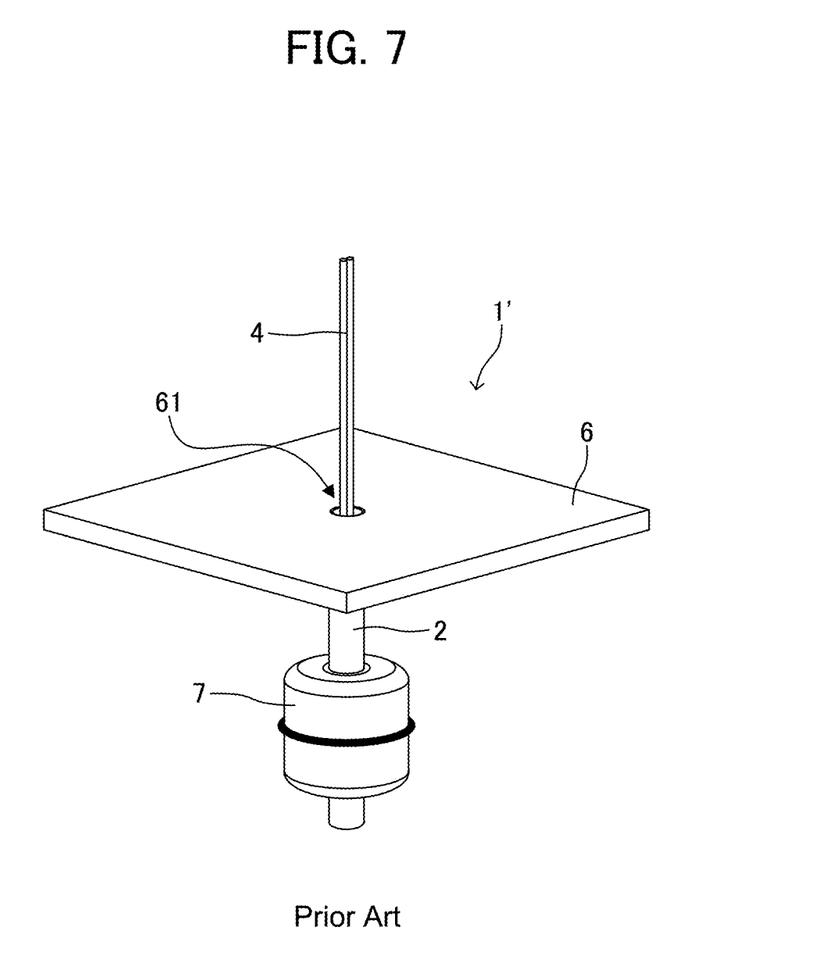
FIG. 7 is a perspective view for showing a sensor according to a conventional technology.

Here, differences between the present invention and the conventional technology in a case where a sensor is to be constituted by preparing the detection part 3 and the conducting wires 4 in the protecting tube 2 fixed indivisibly and integrally with the partition 6 will be explained, referring to drawings. In this explanation for comparison, the protecting tube 2 is fixed indivisibly and integrally with the partition 6. FIG. 7 is a perspective view for showing a sensor 1' according to a conventional technology. The sensor 1' according to the conventional technology exemplified in FIG. 7 is constituted as a liquid level sensor for detecting a position of a liquid level of a liquid stored in the inside of a container similarly to the sensor 1 according to the preferred embodiment of the present invention shown in FIG. 1. Since configurations of the protecting tube 2, the conducting wires 4, the partition 6 and the float 7, as well as the detection part 3, which is not shown, in the sensor 1' shown in FIG. 7 are the same as those in the sensor 1 shown in FIG. 1 and FIG. 2, the same reference signs are used here for them and the explanations thereof are omitted. The only difference in configuration between the sensor 1' and the sensor 1 is that the sensor 1' lacks the fixing member 5 which the sensor 1 comprises.

In the sensor 1' according to the conventional technology shown in FIG. 7, for example, an adhesive, which is not shown, can be used as a means for fixing the detection part 3 and the conducting wires 4 in the inside of the protecting tube 2. The adhesive can be used at the upper end (outer end) of the protecting tube 2 for the purpose of fixing the conducting wires 4 to a surface of an inner wall of the protecting tube 2 in the inside of the protecting tube 2, for example. For example, when a two-component epoxy resin adhesive is used as the adhesive used for this purpose, the conducting wires 4 can be firmly fixed to the protecting tube 2 since a volume change as the adhesive hardens is small. However, since the adhesive is very hard after hardening, it is almost impossible to tear off the conducting wires 4 from the protecting tube 2 without destroying the conducting wires 4, for example, for the purpose of replacing the detection part 3 and the conducting wires 4. On the other hand, a silicone sealant, etc., which is softer than the above-mentioned epoxy resin adhesives, can also be used as an adhesive. However, even in this case, it is not easy to remove the adhesive filled in a narrow space to take out the conducting wires 4, since the conducting wires 4 is adhered to the inside of the protecting tube 2.

Therefore, for example, it is considered to make the adhesion of the conducting wires 4 to the protecting tube 2 at the upper end (outer end) of the protecting tube 2 not so firm by reducing the amount of the adhesive used, such that the conducting wires 4 can be easily removed from the protecting tube 2. However, in this case, there is a possibility that the detection part 3 may move in the inside of the protecting tube 2 or that the position of the detection part 3 may not be fixed, depending on a size and/or weight of the detection part 3. When the detection part 3 and the protecting tube 2 are adhered in order to prevent this, there is a possibility that the detection part 3 may not be removed from the inside of the protecting tube 2 and cannot be pulled out of the protecting tube 2, or that a connection between the conducting wires 4 and the detection part 3 may be disconnected by pulling the conducting wires 4 forcibly, when the detection part 3 is to be pulled out of the protecting tube 2 by pulling the conducting wires 4. When the protecting tube 2 is fixed indivisibly and integrally to the partition 6 of the container in this way, it was extremely difficult to replace the detection part 3 and the conducting wires 4 or to adjust a storage position of the detection part 3 in the protecting tube 2 afterwards in the sensor 1' according to the conventional technology. In addition, such a situation is the same also not only for a liquid level sensor exemplified above, but also for other sensors such as temperature sensors, magnetic sensors and vibration sensors, for example.

Contrary to this, in the sensor 1 according to the present invention exemplified in FIG. 1 to FIG. 6, the detection part 3 can be housed at a predetermined position in the protecting tube 2 by detachably fixing the conducting wires 4 to the fixing member 5, which is independent (a separate member) from the protecting tube 2, in the outside of the protecting tube 2. Since the fixation of the conducting wires 4 to the fixing member 5 can be easily released, the broken detection part 3 can be more easily replaced with a new one or the position of the detection part 3 in the protecting tube 2 can be more easily adjusted afterwards, as compared with the conventional technology. Moreover, for example, in a case where a pressure inside the container becomes high and/or a case where a chemical substance harmful to a human body is stored in the container, etc., leakage of the contents can be certainly prevented by applying the sensor 1 to an airtight container, fixing the protecting tube 2 indivisibly and integrally with the partition 6 of the container and closing the inner end of the protecting tube 2. Furthermore, the sensor 1 has a simpler and compacter configuration as compared with a sensor according to a conventional technology. Therefore, in accordance with the sensor 1, effects as mentioned above can be attained, while avoiding problems, such as increase of a manufacturing cost and a fall of a degree of freedom in designing, for example.

As mentioned above, in accordance with the present invention, the sensor 1 suitable as a sensor attached to a container in which the protecting tube 2 is fixed indivisibly and integrally with the partition 6 of the container is proposed. However, the present invention is not limited to the embodiment in which the protecting tube 2 is fixed indivisibly and integrally with the partition 6, but can be implemented in various embodiments in a scope which does not deviate from the technical ideas of the present invention.

The invention claimed is:

1. A sensor comprising a protecting tube, a detection part, conducting wires and one fixing member, characterized in that:
    said protecting tube is fixed to a through hole formed in a partition of a container,
    an inner end that is one end of said protecting tube is located in the inside of said container, and an outer end that is the other end of said protecting tube opens toward the outside of said container,
    said detection part is housed in the inside of said protecting tube,
    one end of said conducting wires is connected to said detection part in the inside of said protecting tube, and the other end of said conducting wires protrudes toward the outside of said container from said outer end,
    said fixing member is fixed to said partition, and fixes said conducting wires detachably in the outside of said protecting tube,
    said conducting wires are prevented from moving in a longitudinal direction of said protecting tube in the inside of said protecting tube only by said fixing member and said detection part connected to said conducting wires is held at a predetermined position in the inside of said protecting tube, and
    said detection part is configured to move from the predetermined position to a different position in the inside of said protecting tube in response to:
        releasing only the fixation of said conducting wires to said fixing member,
        adjusting a position of said conducting wires in the longitudinal direction of said protecting tube, and
        detachably fixing said conducting wires to said fixing member, wherein the different position of the detection part is determined by said adjusted position of said conducting wires with respect to said fixing member.

2. The sensor according to claim 1, characterized in that:
    said fixing member comprises a main body fixed to said partition and a fixing piece which can be joined to said main body, and
    said conducting wires are pinched and fixed between said main body and said fixing piece.

3. The sensor according to claim 2, characterized in that:
    one of said main body or said fixing piece comprises a fixing hole,
    the other of said main body or said fixing piece comprises a convex part at a position corresponding to a position of said fixing hole, and
    said conducting wires are pushed out toward said fixing hole with said convex part to be fixed, by joining said fixing piece to said main body.

4. A sensor comprising a protecting tube, a detection part, conducting wires and one fixing member, characterized in that:
    said protecting tube is fixed to a through hole formed in a partition of a container,
    an inner end that is one end of said protecting tube is located in the inside of said container, and an outer end that is the other end of said protecting tube opens toward the outside of said container,
    said detection part is housed in the inside of said protecting tube,
    said detection part is a detection part using one or more detection parts chosen from a group consisting of a thermistor, a resistance temperature detector, a thermocouple, a Hall element and a reed switch,
    one end of said conducting wires is connected to said detection part in the inside of said protecting tube, and the other end of said conducting wires protrudes toward the outside of said container from said outer end,
    said fixing member is fixed to said partition, and fixes said conducting wires detachably in the outside of said protecting tube,
    said conducting wires are prevented from moving in a longitudinal direction of said protecting tube in the inside of said protecting tube only by said fixing member and said detection part connected to said conducting wires is held at a predetermined position in the inside of said protecting tube, and
    said detection part is configured to move from the predetermined position to a different position in the inside of said protecting tube in response to:
        releasing only the fixation of said conducting wires to said fixing member,
        adjusting a position of said conducting wires in the longitudinal direction of said protecting tube, and
        detachably fixing said conducting wires only to said fixing member.

5. The sensor according to claim 4, characterized in that:
said fixing member comprises a main body fixed to said partition and a fixing piece which can be joined to said main body, and
said conducting wires are pinched and fixed between said main body and said fixing piece.

6. The sensor according to claim 5, characterized in that:
one of said main body or said fixing piece comprises a fixing hole,
the other of said main body or said fixing piece comprises a convex part at a position corresponding to a position of said fixing hole, and
said conducting wires are pushed out toward said fixing hole with said convex part to be fixed, by joining said fixing piece to said main body.

7. The sensor according to claim 4, characterized in that:
said container is a liquid storage tank,
said detection part is a detection part using a Hall element or a reed switch, and
said sensor further comprises a float which comprises a permanent magnet and can move in the longitudinal direction of said protecting tube.

8. A sensor comprising a protecting tube, a detection part, conducting wires and one fixing member, characterized in that:
said protecting tube is fixed to a through hole formed in a partition of a container,
an inner end that is one end of said protecting tube is located in the inside of said container, and an outer end that is the other end of said protecting tube opens toward the outside of said container,
said container is an airtight container,
said protecting tube is fixed indivisibly and integrally with said partition,
said inner end is closed,
said detection part is housed in the inside of said protecting tube,
one end of said conducting wires is connected to said detection part in the inside of said protecting tube, and the other end of said conducting wires protrudes toward the outside of said container from said outer end,
said fixing member is fixed to said partition, and fixes said conducting wires detachably in the outside of said protecting tube,
said conducting wires are prevented from moving in a longitudinal direction of said protecting tube in the inside of said protecting tube only by said fixing member and said detection part connected to said conducting wires is held at a predetermined position in the inside of said protecting tube, and
said detection part is configured to move from the predetermined position to a different position in the inside of said protecting tube in response to:
releasing only the fixation of said conducting wires to said fixing member,
adjusting a position of said conducting wires in the longitudinal direction of said protecting tube, and
detachably fixing said conducting wires only to said fixing member.

9. The sensor according to claim 8, characterized in that:
said fixing member comprises a main body fixed to said partition and a fixing piece which can be joined to said main body, and
said conducting wires are pinched and fixed between said main body and said fixing piece.

10. The sensor according to claim 9, characterized in that:
one of said main body or said fixing piece comprises a fixing hole,
the other of said main body or said fixing piece comprises a convex part at a position corresponding to a position of said fixing hole, and
said conducting wires are pushed out toward said fixing hole with said convex part to be fixed, by joining said fixing piece to said main body.

11. The sensor according to claim 8, characterized in that:
said detection part is a detection part using one or more detection parts chosen from a group consisting of a thermistor, a resistance temperature detector, a thermocouple, a Hall element and a reed switch.

12. The sensor according to claim 11, characterized in that:
said container is a liquid storage tank,
said detection part is a detection part using a Hall element or a reed switch, and
said sensor further comprises a float which comprises a permanent magnet and can move in the longitudinal direction of said protecting tube.

13. The sensor according to claim 8, characterized in that:
said container is a liquid storage tank,
said detection part is a detection part using a Hall element or a reed switch, and
said sensor further comprises a float which comprises a permanent magnet and can move in the longitudinal direction of said protecting tube.

14. The sensor according to claim 8, characterized in that:
said sensor further comprises a spacer which has a predetermined length, and
said spacer is disposed on said inner end side of said detection part in the inside of said protecting tube.

* * * * *